(12) United States Patent
Schwandner et al.

(10) Patent No.: US 10,707,069 B2
(45) Date of Patent: Jul. 7, 2020

(54) METHOD FOR POLISHING A SEMICONDUCTOR WAFER

(75) Inventors: Juergen Schwandner, Garching (DE); Michael Kerstan, Burghausen (DE)

(73) Assignee: SILTRONIC AG, Munich (DE)

( * ) Notice: Subject to any disclaimer, the term of this patent is extended or adjusted under 35 U.S.C. 154(b) by 2858 days.

(21) Appl. No.: 13/038,455

(22) Filed: Mar. 2, 2011

(65) Prior Publication Data

US 2011/0223841 A1 Sep. 15, 2011

(30) Foreign Application Priority Data

Mar. 10, 2010 (DE) ........................ 10 2010 010 885

(51) Int. Cl.
*B24B 7/22* (2006.01)
*H01L 21/02* (2006.01)

(52) U.S. Cl.
CPC .............................. *H01L 21/02024* (2013.01)

(58) Field of Classification Search
CPC ............ B24B 7/22; B24B 7/228; B24B 9/065
USPC ....................... 451/37, 57, 58, 59, 41, 36, 54
See application file for complete search history.

(56) References Cited

U.S. PATENT DOCUMENTS

| 3,691,694 | A | | 9/1972 | Goetz et al. | |
| 4,129,457 | A | * | 12/1978 | Basi .................................... | 134/2 |
| 4,739,589 | A | | 4/1988 | Brehm et al. | |
| 5,320,706 | A | * | 6/1994 | Blackwell ...................... | 438/693 |
| 5,885,334 | A | | 3/1999 | Suzuki et al. | |
| 6,114,248 | A | | 9/2000 | Gambino et al. | |
| 6,165,052 | A | * | 12/2000 | Yu et al. .......................... | 451/41 |
| 6,390,891 | B1 | | 5/2002 | Guha | |
| 6,641,471 | B1 | | 11/2003 | Pinheiro | |
| 7,540,800 | B2 | * | 6/2009 | Kozasa et al. ..................... | 451/8 |
| 2001/0014570 | A1 | | 8/2001 | Wenski et al. | |
| 2002/0077039 | A1 | | 6/2002 | Wenski et al. | |
| 2002/0151253 | A1 | | 10/2002 | Kollodge et al. | |
| 2003/0109209 | A1 | | 6/2003 | Hishiki | |
| 2004/0077295 | A1 | | 4/2004 | Hellring et al. | |
| 2005/0227590 | A1 | | 10/2005 | Sung | |
| 2008/0299350 | A1 | | 12/2008 | Mezaki et al. | |
| 2008/0305722 | A1 | | 12/2008 | Roettger et al. | |
| 2009/0029552 | A1 | | 1/2009 | Schwandner et al. | |

FOREIGN PATENT DOCUMENTS

| CN | 1 675 327 A | 9/2005 |
| DE | 100 04 578 C1 | 7/2001 |
| DE | 60110820 T2 | 1/2006 |
| DE | 102007035266 A1 | 1/2009 |
| EP | 0 208 315 B1 | 1/1987 |
| JP | 2008091383 A | 4/2008 |
| JP | 2008 300422 A | 12/2008 |
| KR | 19990066842 A | 8/1999 |
| KR | 20080109396 A | 12/2008 |

OTHER PUBLICATIONS

Wei Xin et al., "Stufy on the Performances of Polishing Pad in Chemical-mechanical Polishing", Diamond & Abrasives Engineering, No. 5, 2004, pp. 40-43.

* cited by examiner

*Primary Examiner* — Robert A Rose

(74) *Attorney, Agent, or Firm* — Leydig, Voit & Mayer Ltd.

(57) ABSTRACT

A method of polishing a semiconductor wafer includes polishing a surface of the semiconductor wafer using a polishing pad while supplying a polishing agent slurry containing abrasives during a first step. The polishing pad is free of abrasives and includes a first surface that contacts the semiconductor wafer, the first surface having a surface structure including elevations. Supply of polishing agent slurry is subsequently ended and, in a second step, the surface of the semiconductor wafer is polished using the polishing pad while supplying a polishing agent solution having a pH value of at least 12 that is free of solids.

20 Claims, No Drawings

METHOD FOR POLISHING A SEMICONDUCTOR WAFER

CROSS REFERENCE TO RELATED APPLICATIONS

The present application claims priority from German Application No. DE 10 2010 010 885.5, filed Mar. 10, 2010, which is hereby incorporated by reference herein.

FIELD

The invention relates to a method for polishing a semiconductor wafer.

BACKGROUND

Double-side polishing (DSP) is described in U.S. Pat. No. 3,691,694, for example.

In accordance with one embodiment of DSP as described in EP 208 315 B1, semiconductor wafers in "carrier plates" composed of metal or plastic, which have suitably dimensioned cut-outs, are moved between two rotating polishing plates covered with a polishing pad in the presence of a polishing sol on a path predetermined by the machine and process parameters, and are thereby polished.

DSP is conventionally carried out using a polishing pad composed of homogeneous, porous polymer foam, as described in DE 100 04 578 C1, for example, where it is also stated that the polishing pad adhering to the upper polishing plate is permeated by a network of channels and the polishing pad adhering to the lower polishing plate has a smooth surface without such a texture. This measure is intended firstly to ensure homogeneous distribution of the polishing agent used during the polishing, and secondly to prevent the semiconductor wafer from sticking to the upper polishing pad when the upper polishing plate is lifted after polishing has been completed.

In addition to DSP, so-called CMP polishing is used in order to eliminate defects and to reduce the surface roughness. In the case of CMP, a softer polishing pad is used than in the case of DSP. Moreover, only one side of the semiconductor wafer is polished by means of CMP, namely the side on which components are subsequently intended to be fabricated. CMP methods are described for example in US 2002-0077039 and in US 2008-0305722.

The German Patent Application DE 102 007 035 266 A1 describes a method for polishing a substrate composed of silicon material, comprising two polishing steps of the FAP type, which differ in that a polishing agent slurry containing non-bonded abrasive substance as a solid is introduced between the substrate and the polishing pad in one polishing step, while in the second polishing step the polishing agent slurry is replaced by a polishing agent solution that is free of solids. FAP denotes fixed abrasive polishing, which describes a polishing method that uses polishing pads containing fixedly bonded abrasives.

Thus, there are polishing methods using polishing pads which contain no abrasives, wherein abrasives in the form of a polishing sol are supplied in this case, and also polishing methods using polishing pads containing abrasives, wherein a polishing sol does not have to be supplied.

All these methods are disadvantageous with regard to the geometry and/or nanotopology of the polished wafers. DSP and CMP lead to a decrease in thickness at the edge (Edge Roll-Off). FAP is disadvantageous with regard to the surface roughness.

SUMMARY

In an embodiment, the present invention provides a method of polishing a semiconductor wafer including polishing a surface of the semiconductor wafer using a polishing pad while supplying a polishing agent slurry containing abrasives during a first step. The polishing pad is free of abrasives and includes a first surface that contacts the semiconductor wafer, the first surface having a surface structure including elevations. Supply of polishing agent slurry is subsequently ended and, in a second step, the surface of the semiconductor wafer is polished using the polishing pad while supplying a polishing agent solution having a pH value of at least 12 that is free of solids.

DETAILED DESCRIPTION

In accordance with an exemplary embodiment of the invention, a polishing agent slurry is supplied during a first step of the polishing method. The polishing agent slurry preferably contains abrasives selected from one or more of the group consisting of oxides of the elements aluminium, cerium and silicon.

The size distribution of the abrasive substance particles is preferably monomodal in nature.

The average particle size is 5 to 300 nm, particularly preferably 5 to 50 nm.

The proportion of the abrasive substance in the polishing agent slurry is preferably 0.25 to 20% by weight, particularly preferably 0.25 to 1% by weight.

The use of colloidal silica as polishing agent slurry is particularly preferred.

By way of example, the aqueous polishing agents Levasil® 200 from Bayer AG and Glanzox 3900® from Fujimi can be used.

The polishing agent slurry can contain additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH).

However, the polishing agent slurry can contain one or more further additives, for example surface-active additives such as wetting agents and surfactants, stabilizers acting as protective colloids, preservatives, biocides, alcohols and complexing agents.

The polishing agent solution used in the second step is preferably water or aqueous solutions of the compounds sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof.

The proportion of the stated compounds in the polishing agent solution is preferably 0.01 to 10% by weight.

The pH value of the polishing agent solution is greater than or equal to 12.

The polishing pad used preferably has a porous matrix.

The polishing pad is preferably composed of a thermoplastic or heat-resistant polymer. A multiplicity of materials may be envisaged for the material, for example polyurethanes, polycarbonate, polyamide, polyacrylate, polyester, etc.

The polishing pad preferably comprises solid, microporous polyurethane.

It is also preferred to use polishing pads composed of foamed plates or felt or fibre substrates, which are impregnated with polymers.

Coated/impregnated polishing pads can also be configured such that they have a different pore distribution and different pore sizes in the substrate compared with those in the coating.

In order to control the porosity of the polishing pad, fillers can be introduced into the polishing pad.

Commercially available polishing pads which can be used after a corresponding surface topography has been produced are e.g. the SPM 3100 from Rodel Inc. or the pads of the DCP series and the pads having the trade names IC1000™, Polytex™ or SUBA™ from Rohm & Haas.

The use of hard or very hard polishing pads is preferred, however.

The hardness according to Shore A should be at least 80°.

By way of example, the SUBA™ 1200 from Rohm & Haas having a hardness of 84° according to Shore A is suitable for this purpose.

A polishing pad of the type SUBA™ 800T2 from Nitta Haas Inc. is likewise suitable, and an alternative thereto should have the hardness according to ASKER C (SRIS 0101) of greater than 90.

The use of a polishing pad having a hardness of 80-100° according to Shore A is particularly preferred.

Pads of the type MH-S24A from Nitta Haas Inc. are specified for example with a hardness of up to 86 JIS-A (JIS K 6253A), where a hardness according to JIS-A corresponds to a hardness according to Shore A.

The hardness of the polishing pad is especially preferably 92-100° according to Shore A (very hard polishing pad).

The polishing pad preferably has pyramidal or tile-shaped structures. These microstructures can therefore have, for example, the form of columns having a cylindrical or polygonal cross section or the form of pyramids or truncated pyramids.

The polishing pad preferably has round or oval elevations.

The polishing pad preferably has angular, e.g. hexagonal elevations.

The height of the structures or elevations is preferably greater than or equal to 10 µm up to a few mm.

The extent of the elevations is preferably at least 50 µm to at most 400 µm, particularly preferably 50-200 µm.

The use of polishing pads having circular elevations having a diameter of 50-200 µm is especially preferred.

The elevations are preferably arranged in regular fashion on the polishing pad. The distances between two adjacent elevations is preferably a few µm to approximately 500 µm.

The polishing pad preferably has grooves or channels. The depth of the grooves or channels is preferably 10-200 µm. The distance between two adjacent channels or grooves is preferably a few µm to approximately 500 µm.

A surface of the polishing pad is preferably treated by means of chemical etching in order to produce such structures, elevations, channels or grooves.

A surface of the polishing pad is preferably treated by means of mechanical grinding or milling in order to produce such structures, elevations, channels or grooves.

A surface of the polishing pad is preferably treated by means of sintering or furrowing in order to produce such structures, elevations, channels or grooves.

Preferably, in the second step of polishing with supply of the polishing agent solution, the polishing pressure with which the polishing pad is pressed onto the surface of the semiconductor wafer is reduced versus the polishing pressure used in the first step.

In an embodiment, the invention includes abrasiveless polishing with supply of a polishing agent solution having a high pH value of greater than or equal to 12. A polishing agent slurry is supplied in the first step of the polishing. This first step serves to start the polishing process.

As soon as the polishing process has started, the supply of the polishing agent slurry can be ended.

Instead, an alkaline polishing agent solution is then supplied. Preferably, the polishing time in the second step of the polishing with supply of a polishing agent solution is at least 50%, preferably at least 70%, and especially preferably at least 85%, of the total polishing time. Preferably, only the front side of the semiconductor wafer is polished, wherein the total material removal is preferably not more than 1.0 µm.

The second step of the polishing with supply of a polishing agent solution is preferably effected at reduced polishing pressure. In this case, the polishing pressure is preferably approximately 70 to approximately 200 hPA, whereas at the beginning of the method, when a polishing agent slurry is supplied, the polishing pressure is up to 560 hPa, preferably 250-400 hPa.

Conventional polishing machines such as e.g. the polishing machine of the Reflection type from Applied Materials, Inc. are suitable for carrying out the method.

This polishing machine has hitherto been used in CMP polishing, in particular. It is a multi-plate polishing machine. This polishing machine comprises a 5-zone membrane carrier, which permits the pressure profile of the carrier to be set differently in 5 zones.

In conventional chemical-mechanical polishing methods, polishing agent slurries (silica sol) having a fixed pH value are supplied both in the case of DSP and in the case of CMP in order to obtain the polishing removal. In the case of FAP, abrasives are incorporated in the polishing pad itself.

In embodiments of the present invention, the addition of abrasives is used for starting the polishing process. Immediately after the commencement of the polishing removal until the end of polishing, the polishing is effected without addition of abrasive substances and without polishing pads containing abrasives. The polishing agent slurry initially added serves exclusively as a catalyst that starts the removal polishing process, and is then deactivated.

The geometry- and topography-determining polishing itself takes place without the use of abrasives, whether in the form of externally supplied silica sol particles or in the form of abrasive particles incorporated in the polishing pad.

Conventional CMP process parameters are otherwise employed in the method. The speeds of plate and polishing head are preferably approximately 30-150 rpm. The volumetric flow rate of the polishing agent is preferably 100 to 1000 ml/min. It is also preferred for the polishing head with the wafer guided therein to be moved over the polishing pad in an oscillatory fashion during polishing.

The local polishing pressure on the surface of the semiconductor wafer increases in particular where the local topography of the semiconductor wafer comes into contact with the local elevations of the polishing pad surface. Together with the alkaline polishing agent solution, an abrasiveless topography-dependent removal polishing process is effected on the semiconductor wafer.

This is advantageous in comparison with conventional CMP polishing, especially as the freely movable alkaline-loaded silica sol particles in combination with a soft finishing polishing pad effect further removal even at depressions on the surface of the semiconductor wafer. This can be eliminated by the method according to the invention, which leads to an improvement in the topography of the surface of the semiconductor wafer.

It is especially preferred to apply the method according to the invention to the polishing of the rear side of the semiconductor wafer as an intermediate step between a double-side polishing of the semiconductor wafer and the concluding final polishing of the front side of the semiconductor wafer, that is to say as a process sequence of double-side polishing—abrasiveless polishing of the rear side—polishing of the front side. It is furthermore preferred for the concluding polishing of the front side also to be configured as abrasiveless polishing according to the method according to the invention.

It has been found that embodiments of the polishing method according to the present invention are advantageous with regard to geometry and nanotopology. The inventors attribute the advantageous properties of this predominantly abrasiveless polishing to the fact that the latter eliminates disturbing properties of the polishing slurries used hitherto in the case of DSP and CMP. A three-body interaction of wafer, polishing pad and polishing slurry occurs in the case of DSP and CMP. This leads to a non-selective material removal on the wafer. The material removal is independent of the topography of the wafer in the case of DSP and CMP.

In the case of the polishing silicon wafers on a polishing machine of the Reflection type from Applied Materials using these methods, it has been found that silicon wafers having a slightly concave initial form lead to good polishing results, in particular with regard to the geometry values that can be obtained locally. In order to achieve this, the average removal rate during polishing was kept in a range of approximately 0.05-0.15 µm/min, which was ensured by polishing agent solutions having a pH value of greater than 12.

By comparison with FAP, a significant improvement in the surface roughness of the wafer can be observed as a result of the method according to the invention. Experiments have shown that significantly fewer scratches and defects on the surface are visible by comparison with FAP.

Embodiments of the invention allow even very hard polishing pads to be used.

With the use of silica sol as in the case of CMP, by contrast, the pad hardness that can be used is upwardly limited since, in the case of CMP, as uniform a removal as possible is realized as the interaction of a compliant polishing pad surface and the sol particles loaded with hydroxide ions (OH—) in order to press them as it were softly onto the wafer surface and thus softly to shear away the material with simultaneous chemical attack and to transport it away.

In the case of the substantially abrasiveless polishing of the method described herein, by contrast, the hydroxide ions (OH—) are contacted with the wafer surface in a targeted manner by means of the profiled surface structure of a preferably very hard polishing pad, which leads to a locally delimited increased removal rate at the locations having the highest local pressures, for example if a local elevation of the polishing pad surface impinges on an elevation of the wafer surface.

This results in an ideal removal behaviour which leads to an optimum planarization of the wafer surface whilst at the same time avoiding defects of the wafer surface.

The semiconductor wafer polished by the method according to the invention is preferably a wafer composed of silicon, silicon-germanium, silicon dioxide, silicon nitride, gallium arsenide and further so-called III-V semiconductors.

The use of silicon in monocrystalline form, for example crystallized by means of a Czochralski or float zone process, is preferred.

While the invention has been particularly shown and described with reference to preferred embodiments thereof, it will be understood by those skilled in the art that various changes in form and details may be made therein without departing from the spirit and scope of the invention.

What is claimed is:

1. A method of polishing a semiconductor wafer, the method comprising:
    polishing a surface of the semiconductor wafer using a polishing pad while supplying a polishing agent slurry containing abrasives during a first step, the polishing pad being free of abrasives and including a first surface that contacts the semiconductor wafer, the first surface having a surface structure including elevations, the structure of the first surface being structured by one of chemical etching, grinding, buffing, sintering or furrowing;
    subsequently ending the supply of polishing agent slurry; and
    polishing the surface of the semiconductor wafer so as to decrease a surface roughness of the wafer using the polishing pad in a second step while supplying a polishing agent solution having a pH value of at least 12 that is free of solids.

2. The method as recited in claim 1, wherein the abrasives in the polishing agent slurry include at least one of the group consisting of oxides of the elements aluminum, cerium, and silicon.

3. The method as recited in claim 1, wherein the polishing agent slurry is colloidal silica.

4. The method as recited in claim 1, wherein the polishing pad has a porous matrix.

5. The method as recited in claim 1, wherein the polishing pad includes at least one of a thermoplastic and a heat-resistant polymer.

6. The method as recited in claim 1, wherein the surface structure of the first surface of the polishing pad includes at least one of pyramidal structures, tile-shaped structures, round elevations, oval elevations, hexagonal elevations and grooves.

7. The method as recited in claim 1, further comprising pressing the polishing pad onto the surface of the semiconductor wafer during the first step with a first pressure, and pressing the polishing pad onto the surface of the semiconductor wafer during the second step with a second pressure, the first pressure being greater than the second pressure.

8. The method as recited in claim 1, wherein the abrasives in the polishing agent slurry includes an oxide of aluminum.

9. The method as recited in claim 1, wherein the abrasives in the polishing agent slurry includes an oxide of cerium.

10. The method as recited in claim 1, wherein the abrasives in the polishing agent slurry includes an oxide of silicon.

11. The method as recited in claim 1, wherein a polishing time in the second step of the polishing with supply of a polishing agent solution is at least 50% of a total polishing time.

12. The method as recited in claim 1, wherein a polishing time in the second step of the polishing with supply of a polishing agent solution is at least 70% of a total polishing time.

13. The method as recited in claim 1, wherein a polishing time in the second step of the polishing with supply of a polishing agent solution is at least 85% of a total polishing time.

14. The method as recited in claim 1, wherein a polishing pressure in the second step of the polishing is in a range of from 70 to 200 hPA.

15. The method as recited in claim 1, wherein a polishing pressure in the first step of the polishing, when the polishing agent slurry is supplied, is in a range of from 250 to 560 hPA.

16. The method as recited in claim 1, wherein a polishing pressure in the first step of the polishing, when the polishing agent slurry is supplied, is in a range of from 250 to 400 hPA.

17. The method as recited in claim 1, wherein a polishing pressure in the first step of the polishing, when the polishing agent slurry is supplied, is in a range of from 250 to 560 hPA.

18. The method as recited in claim 1, wherein a polishing pressure in the first step of the polishing, when the polishing agent slurry is supplied, is in a range of from 250 to 400 hPA.

19. The method as recited in claim 1, wherein the pH value of the polishing agent solution in the second step has a pH value of greater than 12.

20. The method as recited in claim 1, comprising, in the first step:
   adding abrasives only for starting the polishing, and, immediately after commencing the polishing, removing the abrasives until the polishing it ended,
   wherein the polishing is effected without addition of abrasive substances and without polishing pads containing abrasives, and
   wherein the polishing agent slurry initially added serves exclusively as a catalyst that starts the polishing, and is then deactivated.

* * * * *